(12) United States Patent
Doyle et al.

(10) Patent No.: US 6,894,516 B1
(45) Date of Patent: May 17, 2005

(54) METHOD AND APPARATUS FOR IMPLEMENTING VERY HIGH DENSITY PROBING (VHDP) OF PRINTED CIRCUIT BOARD SIGNALS

(75) Inventors: Matthew Steven Doyle, Rochester, MN (US); Gregory Roy Edlund, Rochester, MN (US); Brian Edward Gregg, Rochester, MN (US); Lynn Robert Landin, Rochester, MN (US); Thomas W. Liang, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 10/717,748

(22) Filed: Nov. 20, 2003

(51) Int. Cl.[7] .............................................. G01R 31/02
(52) U.S. Cl. ..................................... 324/754; 324/158.1
(58) Field of Search ................................ 324/754–755, 324/72.5, 758, 761, 158.1; 439/65, 80, 717

(56) References Cited

U.S. PATENT DOCUMENTS 4,820,169 A * 4/1989 Weber et al. ................... 439/65

6,592,381 B2 * 7/2003 Cohen et al. .................... 439/80

* cited by examiner

*Primary Examiner*—Minh N. Tang
(74) *Attorney, Agent, or Firm*—Joan Pennington

(57) ABSTRACT

A method and apparatus are provided for implementing very high density signal probing of a printed circuit board having a pad pattern connected to signals of interest. A metal plate includes a plurality of through holes arranged in a predefined pattern that corresponds to the pad pattern on the printed circuit board. At least one signal module is inserted within a selected one of the through holes of the metal plate. Each signal module defines a coaxial connector for electrical mating engagement with a coaxial cable connector and has an embedded resistor. At least one power/ground module is inserted within a selected one of the through holes. Each power/ground module contains a high dielectric constant material between an outer conductor and a center conductor defining a capacitor. The capacitor provides a low impedance path between the metal plate and a power or ground pad of the printed circuit board.

14 Claims, 11 Drawing Sheets

METHOD AND APPARATUS FOR IMPLEMENTING VERY HIGH DENSITY PROBING (VHDP) OF PRINTED CIRCUIT BOARD SIGNALS

FIELD OF THE INVENTION

The present invention relates generally to the data processing field, and more particularly, relates to a method and apparatus for implementing very high density signal probing of a printed circuit board.

DESCRIPTION OF THE RELATED ART

Many high performance computer systems and server systems rely on large-scale packaging of multiple high density interconnect modules and printed circuit boards to accommodate efficient interconnection of increasingly complex, high signal speed, integrated circuit devices within a spatial footprint. Land grid array (LGA) board, module, and connector configurations are commonly used to provide high density, mechanically loaded interconnects in the electronic packaging of a multitude of high performance board and module assemblies used in computer electronics. In the testing of a printed circuit board, for example, during the initial bring up and debugging of system hardware, access to an area of interest on the printed circuit board for probing or connecting to signals often presents a problem.

Probing complex computer systems for logic debug or signal integrity becomes more and more difficult because of growing bus width, higher bus speed, and very limited probe access of highly compact packaging.

Using a custom-designed flex cable to access mechanically constrained areas provides one possible solution to this problem. Flex cables are not integrated into the PCB, and need to be redesigned for each system packaging structure. Because custom flex cable designs are expensive, they represent a significant additional expense in addition to the procurement of the system PCB hardware.

High impedance flexible circuit probes have been used for LGA socketed chip carriers to provide probe access. The flex circuit probe is sandwiched between chip carriers and the PCB using additional and costly interposers. However, the loading of the flex circuit probe can cause bus failure when bus speeds are above 1 GHz and when flex circuit probe lengths become large. Another drawback of the solution is the flex circuit probe must be built in advance and specific signals being probed must be defined at the moment. Once the flex circuit probe is built, only those defined signals can be probed.

U.S. Pat. No. 6,462,528 discloses a method and apparatus for probing a terminal of a ball grid array device, or a conductor of an array of closely-spaced conductors, using a buried tip resistor located substantially adjacent to the point to be monitored. A relatively short stub is provided from the connection point to the tip resistor. A receiver amplifier arrangement substantially eliminates an offset error that is introduced into the signal to be measured due to variation in the resistance value of the tip resistor. The buried tip resistor is made small enough to fit within a BGA pad array, and buried within the layers of a circuit board material. The disclosed probing method and apparatus if applied for multiple signals would consume significant wiring channels in the PCB that typically would be needed for functional wiring.

A need exists for an effective mechanism for implementing very high density signal probing of a printed circuit board.

SUMMARY OF THE INVENTION

A principal object of the present invention is to provide a method and apparatus for implementing very high density signal probing of a printed circuit board. Other important objects of the present invention are to provide such method and apparatus substantially without negative effect and that overcome many of the disadvantages of prior art arrangements.

In brief, a method and apparatus are provided for implementing very high density signal probing of a printed circuit board having a pad pattern connected to signals of interest. A metal plate includes a plurality of through holes arranged in a predefined pattern that corresponds to the pad pattern on the printed circuit board. At least one signal module is inserted within a selected one of the through holes of the metal plate. Each signal module defines a coaxial connector for electrical mating engagement with a coaxial cable connector and has an embedded resistor. At least one power/ground module is inserted within a selected one of the through holes. Each power/ground module contains a high dielectric constant material between an outer conductor and a center conductor defining a capacitor. The capacitor provides a low impedance path between the metal plate and a power or ground pad of the printed circuit board.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
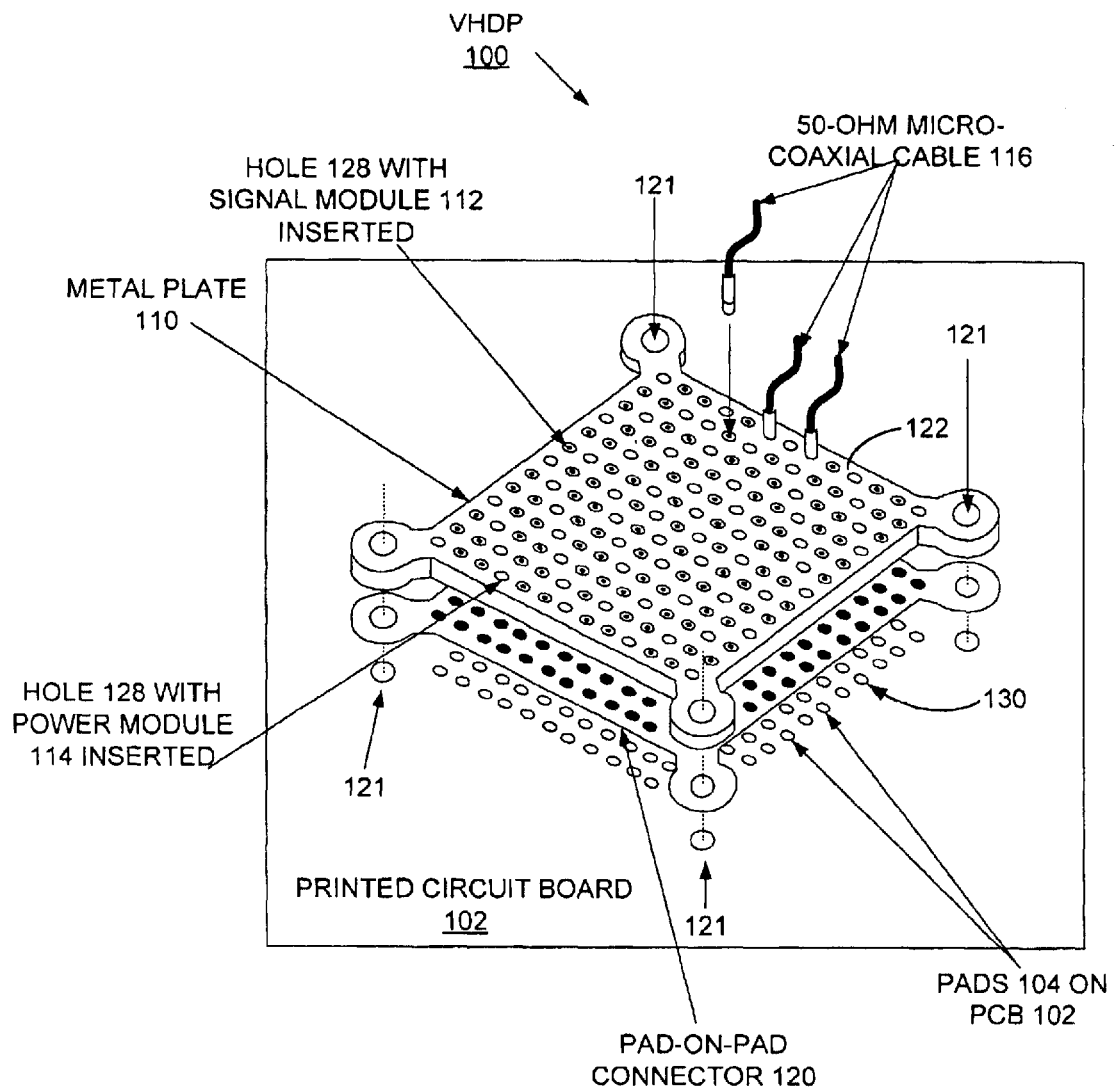
FIG. 1 is an exploded perspective view illustrating a very high density probes (VHDP) structure in accordance with the preferred embodiment.

In accordance with features of the preferred embodiment, a method and structure are provided for implementing very high density probes (VHDP). The method and VHDP structure of the preferred embodiment provides robust and easy probe access, with substantial reduction of probe loading. The method and VHDP structure of the preferred embodiment allows generally unlimited access to any signals of interest.

Having reference now to the drawings, in FIGS. 1–9, there is shown a VHDP structure generally designated by the reference character 100 in accordance with the preferred embodiment. VHDP structure 100 provides access for implementing multiple signal probing of a printed circuit board (PCB) 102 that includes a plurality of pads 104 for mounting, for example, a chip carrier or similar device with respective ones of the pads 104 coupled to various signals of interest.

The PCB pads 104 are electrically connected to mirror pads 105 located on the opposite side (see FIG. 7) of the PCB 102 through electrically conductive vias 106. The mirror pads 105 may be accessible for probing if the chip carrier is soldered. However, if the chip carrier is socketed, the PCB mirror pads 105 typically become inaccessible because a metal plate (not shown) providing mechanical support for the socket covers over these pads 105. VHDP structure 100 in accordance with the preferred embodiment enables probing signals from the PCB 102 both when the chip carrier is soldered, and when the chip carrier is socketed and the PCB mirror pads 105 are inaccessible.

VHDP structure 100 in accordance with the preferred embodiment includes a metal plate 110 containing a plurality of signal modules 112, a plurality of power/ground modules 114, and micro coaxial cables 116 with a respective mating coaxial connector 118 at the ends. The signal and power/ground modules 112, 114 are connected to PCB pads 104 with a pad-on pad connector 120. Various commercially available connectors can be used for the pad-on pad connector 120. VHDP structure 100 includes corresponding alignment features generally designated by reference character 121 for precisely aligning the metal plate 110, the pad-on pad connector 120, and the PCB 102 for mounting the VHDP structure together, for example, with fasteners (not shown).

Figure 2:
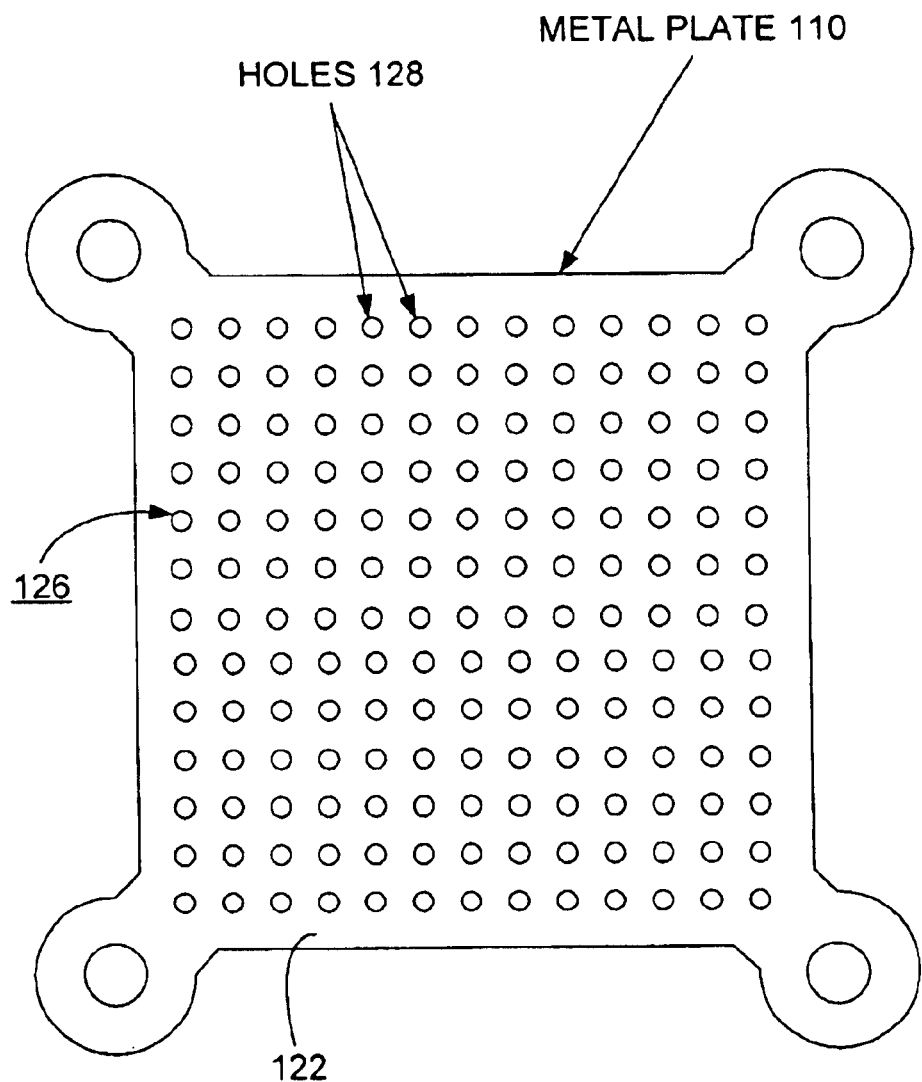
FIGS. 2 and 3 are respective top and bottom plan views of a metal plate of the VHDP structure of FIG. 1 in accordance with the preferred embodiment.
Figure 3:
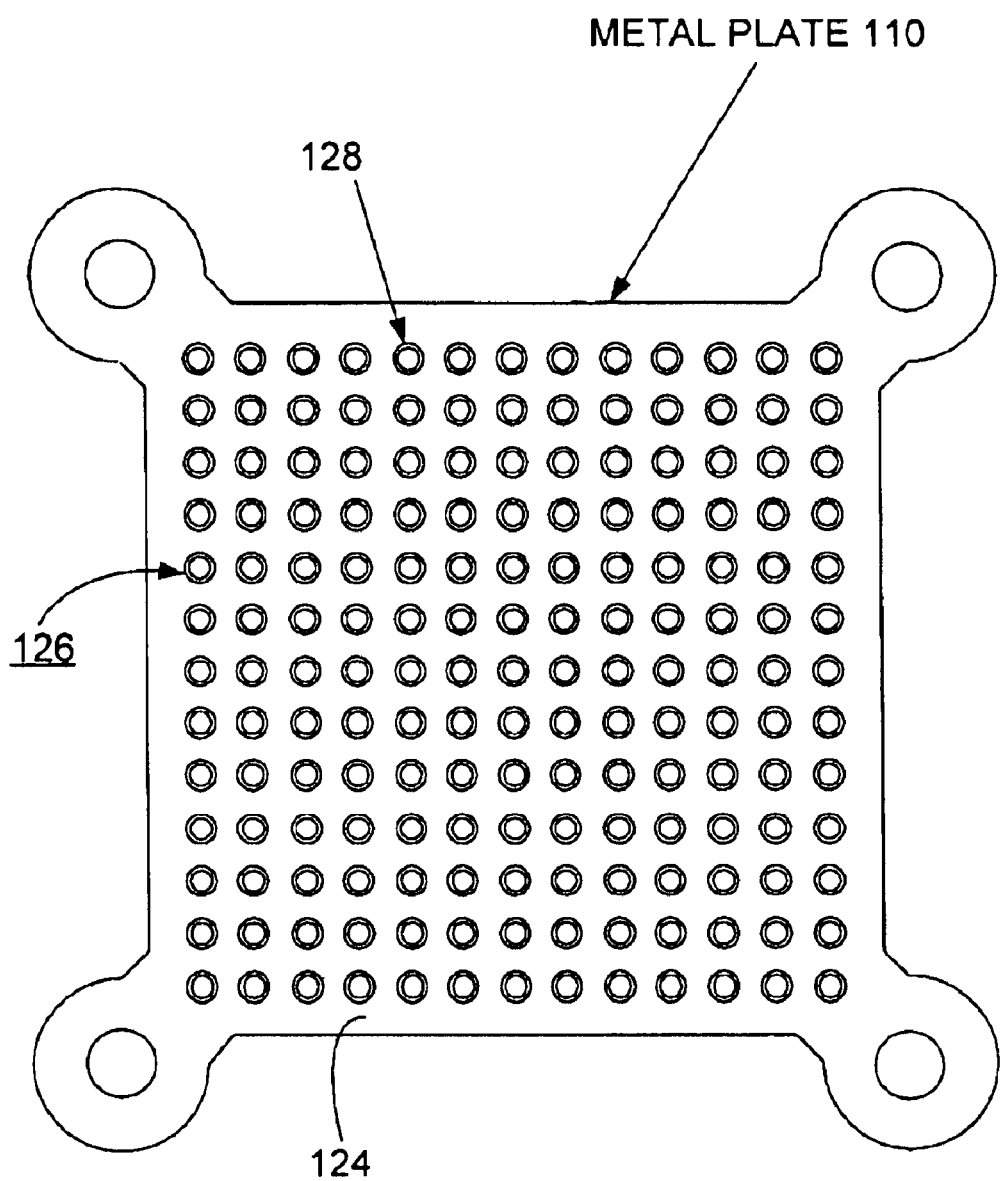

Referring now to FIGS. 2 and 3, there are shown respective top and bottom sides 122, 124 of the metal plate 110. The metal plate 110 has a predetermined pattern 126, such as, an array of holes 128 corresponding to or substantially matching a pad pattern 130 of pads 104 on the PCB 102, corresponding to desired signals to be probed, for example, where a chip carrier is mounted to mirror pads 105 on the opposed side of the PCB 102. The metal plate 110 is formed, for example, of aluminum, titanium, nichrome or copper.

Figure 4:
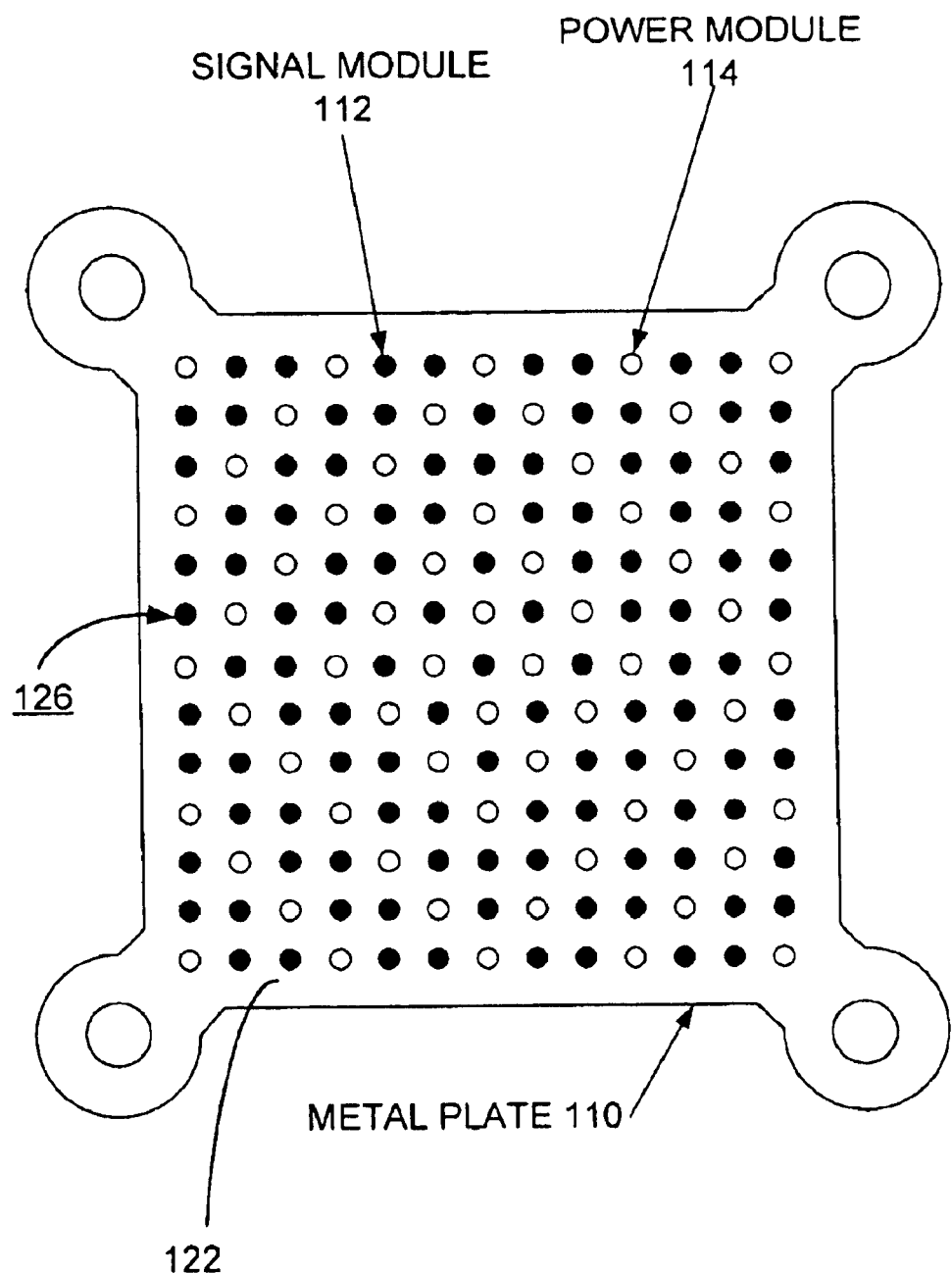
FIGS. 4 and 5 are respective top and bottom plan views of the metal plate with signal modules and power/ground modules inserted within selected openings of the metal plate of the VHDP structure of FIG. 1 in accordance with the preferred embodiment.
Figure 5:
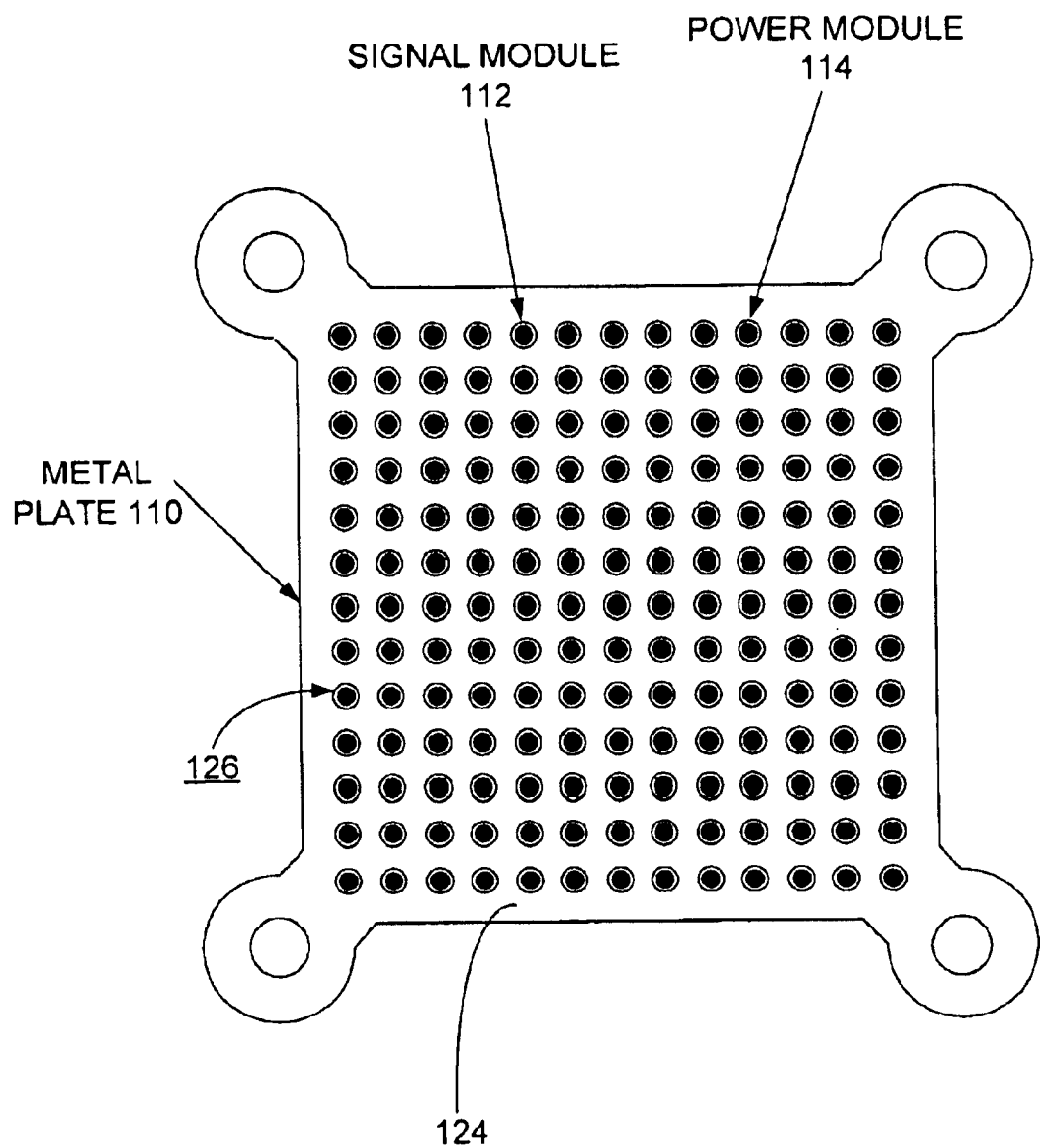

Referring also to FIGS. 4 and 5, signal modules 112 are inserted into selected holes 128 corresponding to selected ones of PCB's signal pads 104. Power/ground modules 114 are inserted into selected holes corresponding to selected ones of PCB's power/ground pads 104.

Figure 6A:
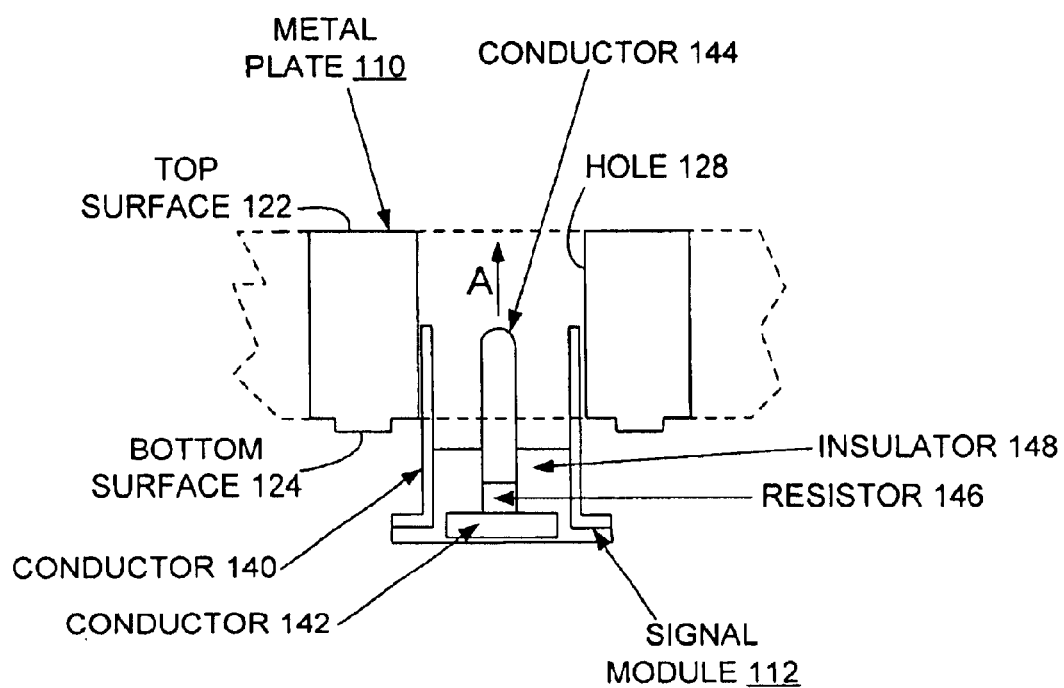
FIGS. 6A, 6B, and 6C illustrate a signal module of the VHDP structure of FIG. 1 in accordance with the preferred embodiment.
Figure 6B:
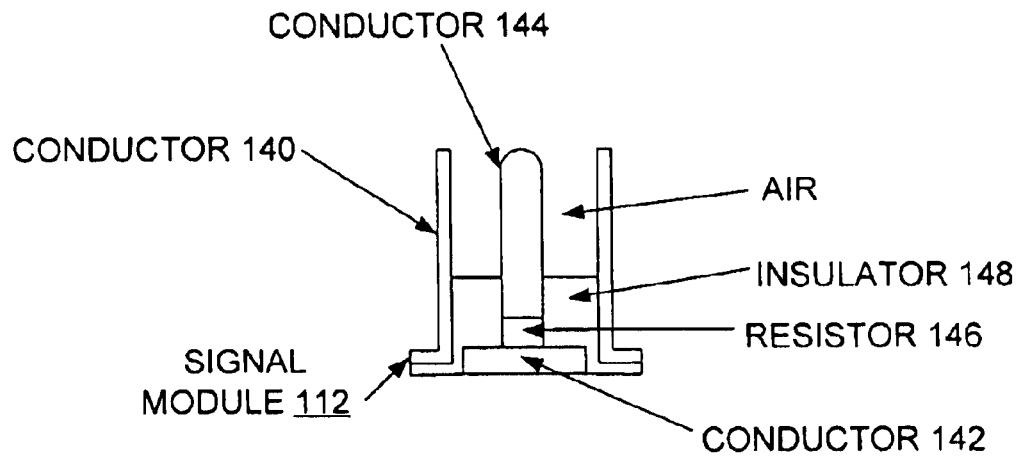
Figure 6C:
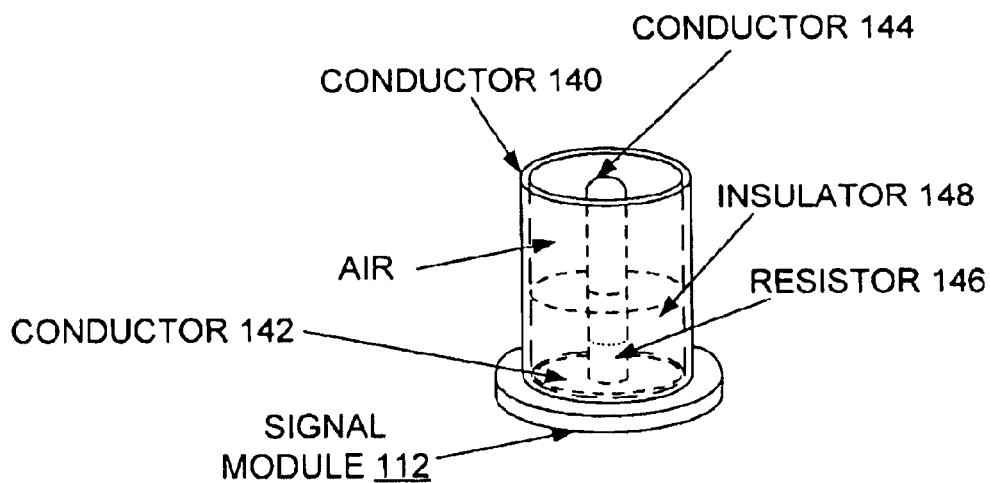

Referring now to FIGS. 6A, 6B, and 6C, the signal module 112 of the VHDP structure 100 is illustrated not to scale in accordance with the preferred embodiment. FIG. 6A is a side view illustrating the signal module 112 being inserted within a particular through hole 128 to be aligned with a signal pad 104 from the bottom side 124 of the metal plate 110 as indicated by an arrow labeled A. In FIGS. 6B and 6C, a respective side view and perspective view of signal module 112 is shown. In the perspective view of signal module 112 in FIG. 6C, interior details of the signal module 112 are shown in dotted line.

Each signal module 112 defines a resistor-embedded micro coaxial connector. Signal module 112 includes an outer conductor 140 made of an electrically conductive material with sufficient mechanical strength to permit mounting the signal module 112 to a mating coaxial cable connector 118 and to function as a housing for the other components making up the coaxial connector 112. Signal module or coaxial connector 112 includes a base conductor 142 and a central conductor 144 contained within the outer conductor 140. A resistor 146 is located between the generally circular base conductor 142 and the elongated central conductor 144 for minimizing the loading on the signal to be monitored. An electrically insulating insert or insulator 148 made of an electrically insulating material is inserted into the outer conductor. This insulator 148, extending around the base conductor 142 and extending around a lower portion of the elongated central conductor 144, mechanically secures and electronically isolates the outer conductor 140 from the base conductor 142 and the center conductor 144. Ambient air is received within the space between the outer conductor 140 and the center conductor 144 above the insulator 148. Each of the outer conductor 140, base conductor 142 and central conductor 144 is formed, for example, of aluminum, titanium, nichrome or copper.

In accordance with features of the preferred embodiment, by incorporating resistor-embedded micro coaxial connector modules 112 into the metal plate 110, the probe access becomes robust, easy, and highly flexible. The high-resistance embedded resistors 146 advantageously minimize the loading on the signals being probed.

Figure 7:
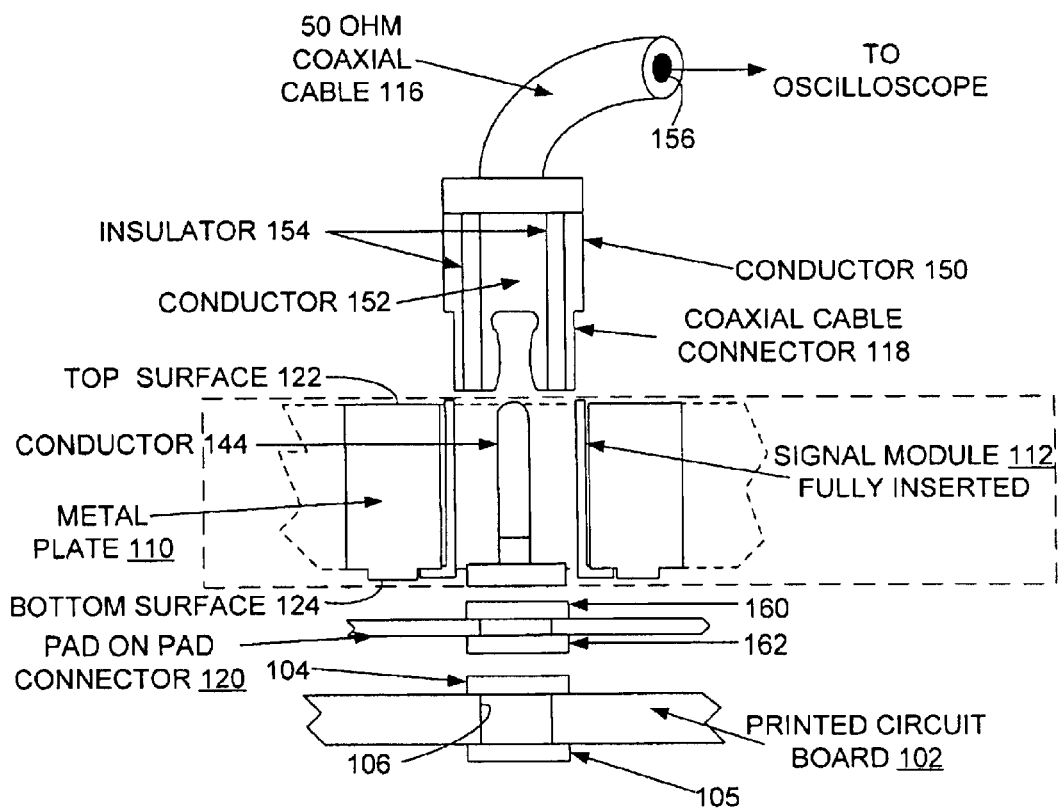
FIG. 7 is an enlarged fragmentary view illustrating a signal module fully inserted in the metal plate of the VHDP structure of FIG. 1 in accordance with the preferred embodiment.

FIG. 7 illustrates the signal module 112 fully inserted in the metal plate 110 together with the micro coaxial cable 116 with the mating coaxial connector 118, and pad-on pad connector 120 of the VHDP structure 100 shown separately in more detail with the PCB 102. Once the signal module 112 is fully inserted into the metal plate 102, a 50-ohm micro-coaxial cable 116 with the mating coaxial receptacle connector can be plugged into the signal module to bring the probed signal to a test instrument input, such as a 50-ohm oscilloscope input. The mating coaxial connector 118 includes a stepped outer conductor 150 received in mating engagement with outer conductor 140 of the signal module 112. The mating coaxial connector 118 includes a central conductor 152 received in mating engagement with central conductor 144 of the signal module 112 and electrically insulated from the stepped outer conductor 150 by an insulator 154. The central conductor 152 of the mating coaxial connector 118 is electrically connected to a central conductor 156 of the micro-coaxial cable 116. When VHDP structure 100 is assembled together for signal probing, an upper pad 160 of the pad-on pad connector 120 is located in mating engagement with the base conductor 142 of the signal module 112 and a lower pad 162 is located in mating engagement with the printed circuit board pad 104.

Figure 8A:
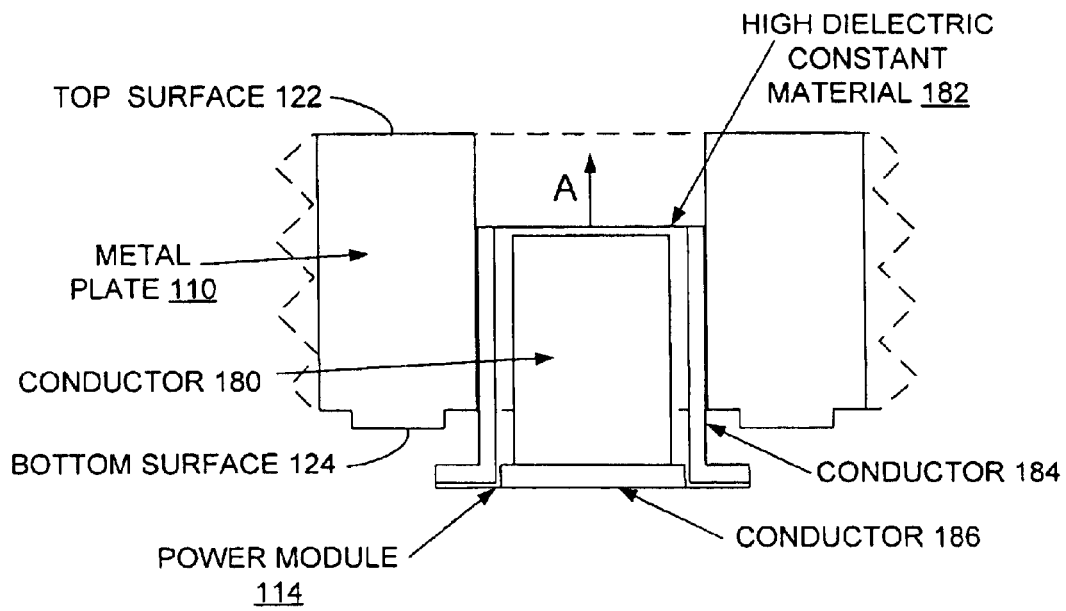
FIGS. 8A, 8B, and 8C illustrate a power/ground module of the VHDP structure of FIG. 1 in accordance with the preferred embodiment.
Figure 8B:
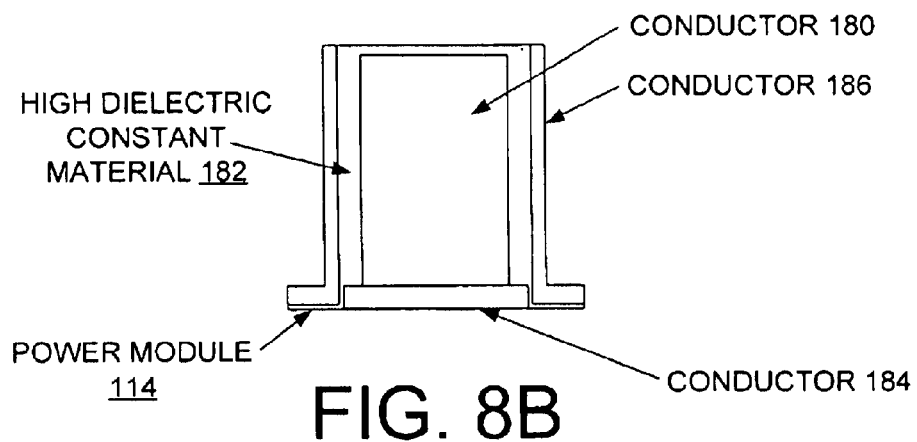
Figure 8C:
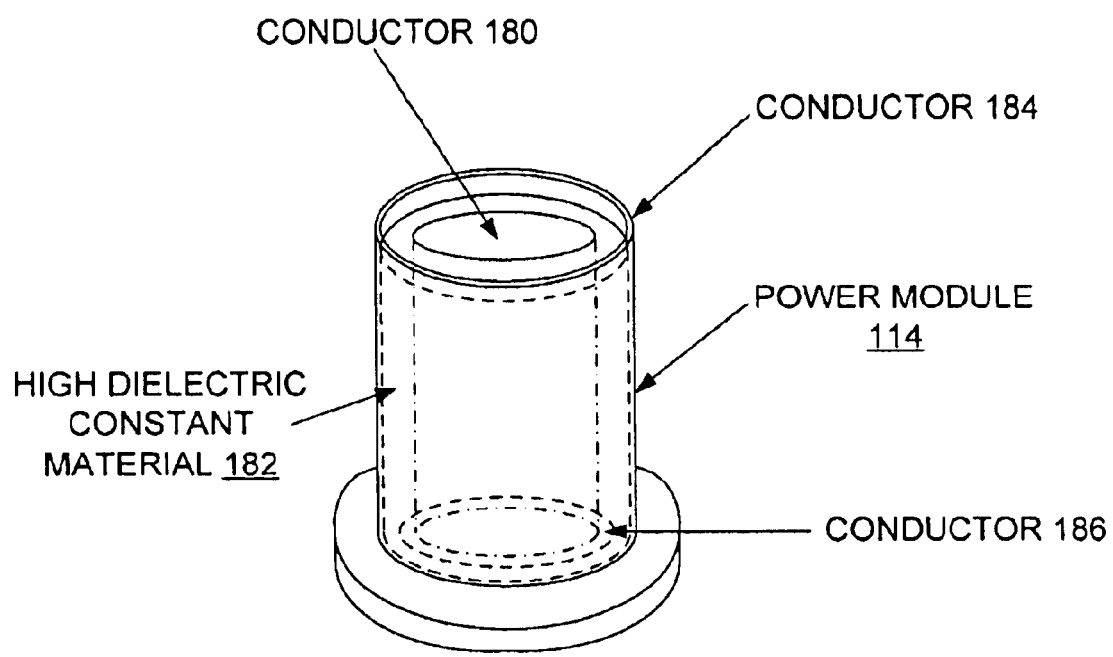

Referring now to FIGS. 8A, 8B, and 8C, the power/ground module 114 of the VHDP structure 100 is illustrated not to scale in accordance with the preferred embodiment. FIG. 8A is a side view illustrating the power/ground module 114 being inserted within a particular through hole 128 to be aligned with a power or ground pad 104 from the bottom side 124 of the metal plate 110 as indicated by an arrow labeled A. In FIGS. 8B and 8C, a respective side view and perspective view of the power/ground module 114 is shown. In the perspective view of power/ground module 114 in FIG. 8C, interior details of the power/ground module 114 are shown in dotted line.

The power/ground module 114 is similar to the signal module 112; however, power/ground module 114 does not include a resistor, and a center conductor 180 of the power/ground module 114 is larger than the center conductor 144 of the signal module 112. A very high dielectric constant material 182 is also disposed between an outer conductor 184 and extending around a base conductor 186 and the elongated central conductor 180 to form a capacitor with the power/ground module 114. The capacitor formed by power/ground module 114 provides a low impedance path between metal plate 110 and a particular power or ground pad 104 of the PCB 102. The capacitor high dielectric constant material 182 includes, for example, inorganic non-metallic oxides or other high-dielectric constant materials, such as having a dielectric constant substantially greater than 1000. Each of the center conductor 180, outer conductor 184, and base conductor 186 is formed, for example, of aluminum, titanium, nichrome or copper.

Figure 9:
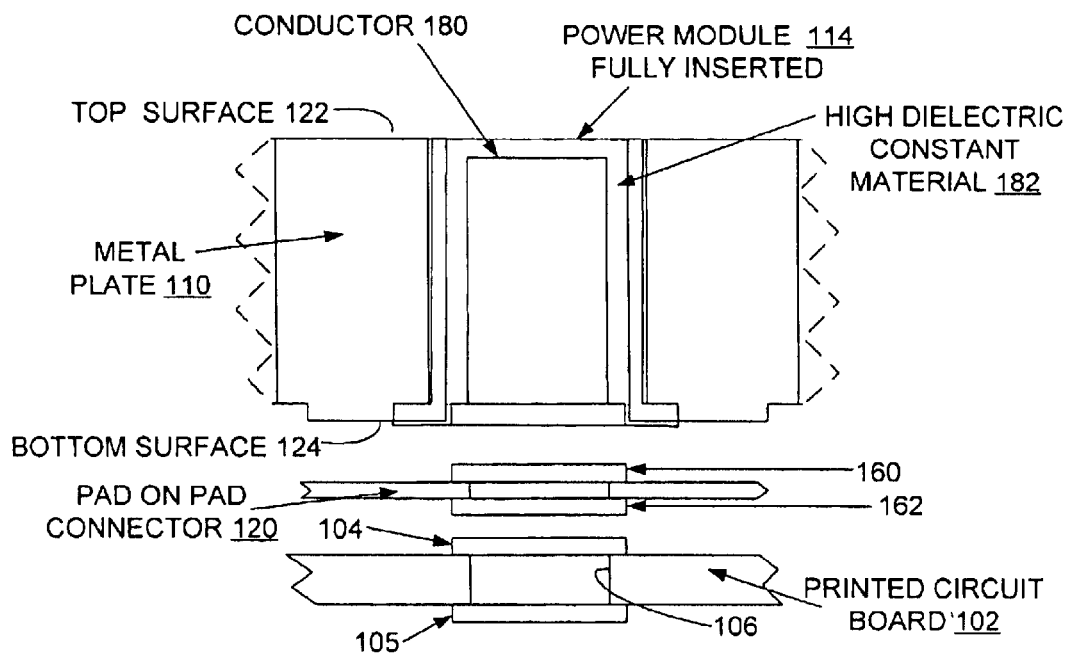
FIG. 9 is an enlarged fragmentary view illustrating a power/ground module fully inserted in the metal plate of the VHDP structure of FIG. 1 in accordance with the preferred embodiment.

Referring now to FIG. 9 illustrates the power/ground module 114 fully inserted in the metal plate 110 together with the pad-on pad connector 120 of the VHDP structure 100 shown separately from the PCB 102. Once a selected number of the power/ground modules 114 are fully inserted into the metal plate 102, the metal plate 110 becomes an AC ground for all the probed signals.

While the present invention has been described with reference to the details of the embodiments of the invention shown in the drawing, these details are not intended to limit the scope of the invention as claimed in the appended claims.

What is claimed is:

1. Apparatus for implementing very high density signal probing of a printed circuit board having a pad pattern connected to signals of interest, said apparatus comprising:
    a metal plate including a plurality of through holes arranged in a predefined pattern; said predefined pattern corresponding to the pad pattern on the printed circuit board;
    at least one signal module; each said signal module being inserted within a selected one of said through holes; each said signal module defining a coaxial connector for electrical mating engagement with a coaxial cable connector and having an embedded resistor; and
    at least one power/ground module; each said power/ground module inserted within a selected one of said through holes; each said power/ground module containing a high dielectric constant material between an outer conductor and a center conductor defining a capacitor; said capacitor providing a low impedance path between said metal plate and a power or ground pad of the printed circuit board.

2. Apparatus for implementing very high density signal probing of a printed circuit board as recited in claim 1 includes a pad-on-pad connector connected between each said signal module and each said power/ground module and corresponding pads on the printed circuit board.

3. Apparatus for implementing very high density signal probing of a printed circuit board as recited in claim 1 wherein each said signal module includes an outer conductor made of an electrically conductive material arranged for mounting said signal module to a mating coaxial cable connector.

4. Apparatus for implementing very high density signal probing of a printed circuit board as recited in claim 3 wherein each said signal module further includes a base conductor and a central conductor contained within said outer conductor; said central conductor received in mating engagement with a central conductor of said mating coaxial cable connector and electrically insulated from said outer conductor; and said base conductor electrically coupled to a signal pad on the printed circuit board.

5. Apparatus for implementing very high density signal probing of a printed circuit board as recited in claim 4 wherein said embedded resistor is located between said base conductor and said central conductor for minimizing the loading on the signal to be monitored.

6. Apparatus for implementing very high density signal probing of a printed circuit board as recited in claim 4 wherein outer conductor makes electrical contact with said metal plate.

7. Apparatus for implementing very high density signal probing of a printed circuit board as recited in claim 1 wherein said center conductor of each said power/ground includes a base portion electrically coupled to said power or ground pad on the printed circuit board, and an elongated conductor portion supported by said base portion extending within said outer conductor.

8. Apparatus for implementing very high density signal probing of a printed circuit board as recited in claim 7 wherein said high dielectric constant material extends around said base portion and said elongated conductor portion within said outer conductor defining said capacitor.

9. Apparatus for implementing very high density signal probing of a printed circuit board as recited in claim 7 wherein outer conductor makes electrical contact with said metal plate.

10. Apparatus for implementing very high density signal probing of a printed circuit board as recited in claim 1 wherein said metal plate includes alignment features for alignment with cooperating features of the printed circuit card.

11. A method for implementing very high density signal probing of a printed circuit board having a pad pattern connected to signals of interest, said method comprising the steps of:
    providing a metal plate including a plurality of through holes arranged in a predefined pattern; said predefined pattern corresponding to the pad pattern on the printed circuit board;
    providing a signal module defining a coaxial connector for electrical mating engagement with a coaxial cable connector and having an embedded resistor;
    inserting at least one signal module within a selected one of said through holes;
    providing a power/ground module containing a high dielectric constant material between an outer conductor and a center conductor defining a capacitor; and
    inserting at least one power/ground module within a selected one of said through holes; said capacitor defined by each said power/ground module providing a low impedance path between said metal plate and a respective power/ground pad of the printed circuit board.

12. A method for implementing very high density signal probing of a printed circuit board as recited in claim 11 includes providing said metal plate with alignment features for alignment with cooperating features of the printed circuit card.

13. A method for implementing very high density signal probing of a printed circuit board as recited in claim 11 includes providing said embedded resistor for minimizing the loading on the signal to be monitored.

14. A method for implementing very high density signal probing of a printed circuit board as recited in claim 13 includes providing said embedded resistor between a base conductor electrically coupled to a signal pad on the printed circuit board and a central conductor electrically coupled to said mating coaxial cable connector.

* * * * *